(12) United States Patent
Chanda et al.

(10) Patent No.: US 8,420,537 B2
(45) Date of Patent: *Apr. 16, 2013

(54) STRESS LOCKING LAYER FOR RELIABLE METALLIZATION

(75) Inventors: Kaushik Chanda, Fishkill, NY (US); Ronald G. Filippi, Wappingers Falls, NY (US); Charles C. Goldsmith, Poughkeepsie, NY (US); Ping-Chuan Wang, Hopewell Junction, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 886 days.

This patent is subject to a terminal disclaimer.

(21) Appl. No.: 12/127,878

(22) Filed: May 28, 2008

(65) Prior Publication Data

US 2009/0297759 A1    Dec. 3, 2009

(51) Int. Cl.
*H01L 21/302*      (2006.01)
*B44C 1/22*      (2006.01)

(52) U.S. Cl.
USPC ............. 438/692; 438/689; 438/693; 216/88; 216/89

(58) Field of Classification Search ............... 438/689, 438/692, 693; 216/88, 89
See application file for complete search history.

(56) References Cited

U.S. PATENT DOCUMENTS

| | | | |
|---|---|---|---|
| 6,054,744 A | | 4/2000 | Hu et al. |
| 6,368,967 B1 | * | 4/2002 | Besser .......................... 438/687 |
| 6,406,996 B1 | * | 6/2002 | Bernard et al. ............... 438/653 |
| 6,531,193 B2 | | 3/2003 | Fonash et al. |
| 7,109,121 B2 | | 9/2006 | Lal et al. |
| 7,205,202 B2 | | 4/2007 | Orlowski et al. |
| 7,351,655 B2 | | 4/2008 | Cunningham |
| 2006/0254504 A1 | * | 11/2006 | Dai et al. ........................ 117/84 |
| 2007/0070575 A1 | * | 3/2007 | Sekimoto et al. ............. 361/234 |
| 2008/0050874 A1 | * | 2/2008 | Won et al. ..................... 438/250 |
| 2010/0323517 A1 | * | 12/2010 | Baker-O'Neal et al. ...... 438/653 |

* cited by examiner

*Primary Examiner* — Shamim Ahmed
(74) *Attorney, Agent, or Firm* — John A. Jordan; Katherine S. Brown

(57) ABSTRACT

Recrystallization and grain growth of metal, such as Cu, is achieved at higher anneal temperatures of 150° C. to 400° C., for example, for short anneal times of five to sixty minutes by forming a metal stress locking layer on the Cu before anneal and chemical-mechanical polishing. The stress locking layer extends the elastic region of the Cu by suppressing atom diffusion to the free surface, resulting in near zero tensile stress at room temperature after anneal. Stress voiding, which creates reliability problems, is thereby avoided. Improved grain size and texture are also achieved. The stress locking layer is removed after anneal by chemical-mechanical polishing leaving the Cu interconnect with low stress and improved grain size and texture.

11 Claims, 7 Drawing Sheets

| SAMPLE | #1 NO CAP - 100C ANNEAL | #2 NO CAP - 300C ANNEAL | #3 100A TaN CAP - 100C ANNEAL | #4 100A TaN CAP - 300C ANNEAL | #5 300A TaN CAP - 100C ANNEAL | #6 300A TaN CAP - 300C ANNEAL |
|---|---|---|---|---|---|---|
| 25C | 4.7 | 4.7 | 9.1 | 9.5 | 8.3 | 9.1 |

FIG. 6

STRESS LOCKING LAYER FOR RELIABLE METALLIZATION

BACKGROUND OF THE INVENTION

1. Field of the Invention

The present invention relates to electronic interconnect structures and, more particularly, to methods and structures for making the microstructure in metallization more effective and reliable as an electronic interconnect.

2. Background and Related Art

It is well known that the microstructure in metallization plays one of the more critical roles in dictating the reliability of electronic interconnects, including the electromigration and stress voiding behaviors. For example, it is known that large columnar or bamboo-type grain structures in copper and aluminum interconnects, with grain boundaries across the interconnect film thickness and line width, are the most favorable grain structures in terms of electromigration stability and reliability. This is thought to be due to the fact that grain boundaries are the fast diffusion paths during electromigration, and having grain boundaries oriented perpendicular to the electromigration flux significantly slows down the mass transport.

It is known that desirable grain structure, and particularly grain growth, can be achieved by annealing the metallization during electronic device fabrication. For example, annealing electroplated copper (Cu) before standard chemical-mechanical polishing (CMP) of the device to planarize the copper, typically may be performed at 100° C. for around an hour. Such annealing promotes a recrystallization and grain growth in the Cu structure, wherein grain growth lowers energy by reducing grain boundary area, while recrystallization lowers energy by eliminating mechanically strained grains.

Since recrystallization and grain growth are both thermally activated processes involving atomic diffusion, it is desirable to anneal at higher temperatures so as to reduce the anneal process time. However, it has been found that high temperature anneal results in reliability exposure due to stress voiding. In this regard, it is noted that the impact of annealing the metal film on stress voiding reliability is due to thermal stress generation and relaxation. It is understood that because of the mismatch in thermal expansion coefficients between the metal film and the surrounding dielectric structure and substrate, significant thermal stress is induced from temperature change.

Accordingly, when annealing a metal at elevated temperatures, such as around 300° C. and above, the metal film is subjected to compressive stress which tends to relax by atomic diffusion on the surface and grain boundaries, and thus forms hillocks on the free surface. As a result, it is understood that the metal film is subjected to large tensile stress when it is cooled to lower temperatures resulting in stress voids at device operating temperatures.

Neither the hillock formation on the free surface nor the stress voids are desirable in terms of creating a reliable and effective interconnect structure. It is, therefore, important to reduce the stress relaxation at elevated annealing temperatures so that microstructure stabilization in the metallization layer can be accelerated without compromising stress voiding reliability.

SUMMARY OF THE PRESENT INVENTION

Thus, in accordance with the present invention, a method and structure is provided which acts to allow high temperature anneal of layers of interconnect metal, such as Cu, within a relatively short period of time so as to cause recrystallization and grain growth without affecting the reliability of the annealed interconnect structure. Such method and structure acts to achieve such results using a sacrificial stress locking layer to reduce stress relaxation at elevated anneal temperatures and at the same time improve [111] fiber texture where all grains in the metal film have their (111) crystallographic planes oriented parallel to the film plane. The recrystallization and grain growth result in columnar microstructure boundaries that are oriented substantially perpendicular to the plane of the layers of metal.

In one aspect of the present invention, a method for forming an electrical interconnect structure comprises the steps of: providing a dielectric substrate with a trench; forming an interconnect layer of metal on said substrate and in said trench; forming a stress locking layer on said layer of metal; annealing said layer of metal at a temperature between 150° C. and 400° C. for between five to sixty minutes; and removing said stress locking layer on said layer of metal to form an electrical interconnect with low tensile stress.

In other aspects of the present invention, the interconnect layer of metal is Cu and said stress locking layer may be any of refractory metals and intermetallic materials, such as, tantalum (Ta), tantalum nitride (TaN), titanium (Ti), titanium nitride (TiN), ruthenium (Ru), ruthenium nitride (RuN), tungsten (W), tungsten nitride (WN), cobalt (Co) and cobalt tungsten phosphide (CoWP).

In another aspect of the present invention, a method for annealing a thin layer of metal for recrystallization and grain growth of said metal comprises the steps of: providing a layer of dielectric substrate material; forming a trench in said layer of dielectric substrate material; forming a layer of metal in at least said trench in said layer of dielectric substrate material; forming a stress locking layer on said layer of metal; annealing said layer of metal at a temperature between 150° C. and 400° C. for between five to sixty minutes whereby said stress locking layer acts to reduce stress relaxation by atomic diffusion at said annealing temperatures and times to minimize stress voiding and increase grain size and fiber texture; and removing said stress locking layer from said layer of metal.

In yet another aspect of the present invention, a method is provided for forming an electrical interconnect structure for a semiconductor device by: providing a semiconductor substrate structure; forming a trench in a portion of the surface area of said semiconductor substrate structure, said trench having side walls and a bottom surface; blanket forming a conductive liner on said surface of said semiconductor structure and on the said side walls and bottom surface of said trench; forming a seed layer over the surface of said conductive liner; forming a layer of Cu over said seed layer; forming a stress locking layer on said layer of Cu; annealing said layer of Cu at a temperature between 150° C. and 400° C. for between five and sixty minutes; and removing said stress locking layer by planarizing said stress locking layer and said layer of Cu to form a Cu interconnect structure in said trench planar with the surface of said semiconductor structure.

In further aspects of the present invention, the formed Cu interconnect structure exhibits near zero stress at about 100° C. device operating temperature and further exhibits large grain and columnar microstructure boundaries with said columnar microstructure boundaries oriented substantially perpendicular to the conductive path of said Cu interconnect structure.

In yet a further aspect of the present invention, an electrical interconnect structure for a semiconductor device is provided comprising: a semiconductor substrate having a trench structure formed in a portion of the surface of said substrate with said trench structure having side walls and a bottom surface; and a layer of Cu formed in said trench and planar with the surface of said substrate, said layer of Cu being at less than 100 Mpa tensile stress at room temperature and having a large grain size and columnar microstructure with said columnar microstructure having boundaries oriented substantially perpendicular to the conductive path of said layer of Cu.

Other aspects of the present invention comprise said layer of Cu having grain structures of high [111] texture and having tensile stress near zero.

BRIEF DESCRIPTION OF THE DRAWING

FIG. 6 shows texture values of several samples of annealing Cu with and without the stress locking cap layer.

DETAILED DESCRIPTION OF THE DRAWINGS

Figure 1A:
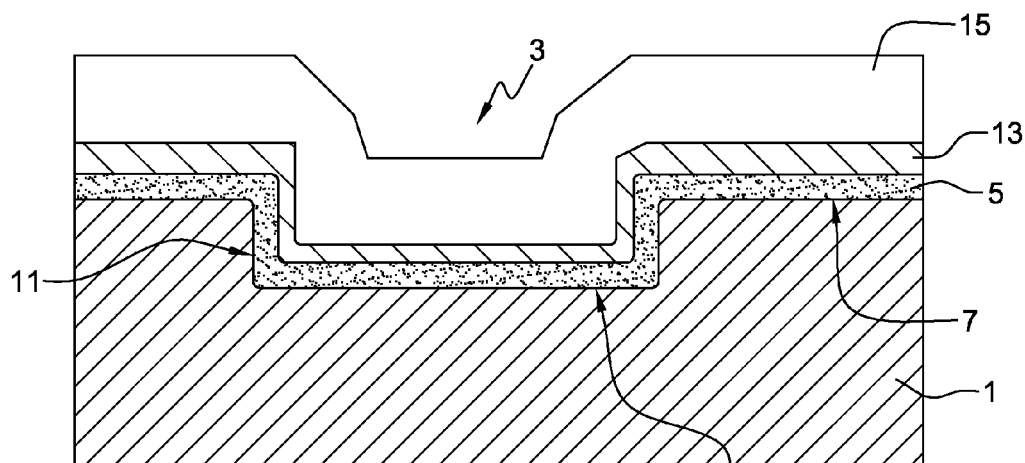
FIGS. 1A-1C show the steps for a conventional metallization fabrication process employing annealing, such as, that employed in annealing Cu metallization.

With reference to FIGS. 1A-IC, there is shown the conventional steps employed in fabricating metallization, such as Cu, employing an anneal step to promote grain growth. The annealing step is normally undertaken before the CMP step and is performed at around 100° C. for one hour.

As shown in FIG. 1A, a layer of dielectric material 1, such as semiconductor material, is etched to form a trench 3. A liner 5 of conductive material is then conformally deposited on the surface 7 of semiconductor layer 1 and in trench 3 of the semiconductor layer, including bottom surface 9 and side walls 11 of the trench. A seed layer 13 of Cu, for example, is then similarly conformally deposited over liner 5 and Cu layer 15 is then conformally electroplated onto the seed layer. It should be understood that the relative thicknesses shown are not to scale.

Figure 1B:
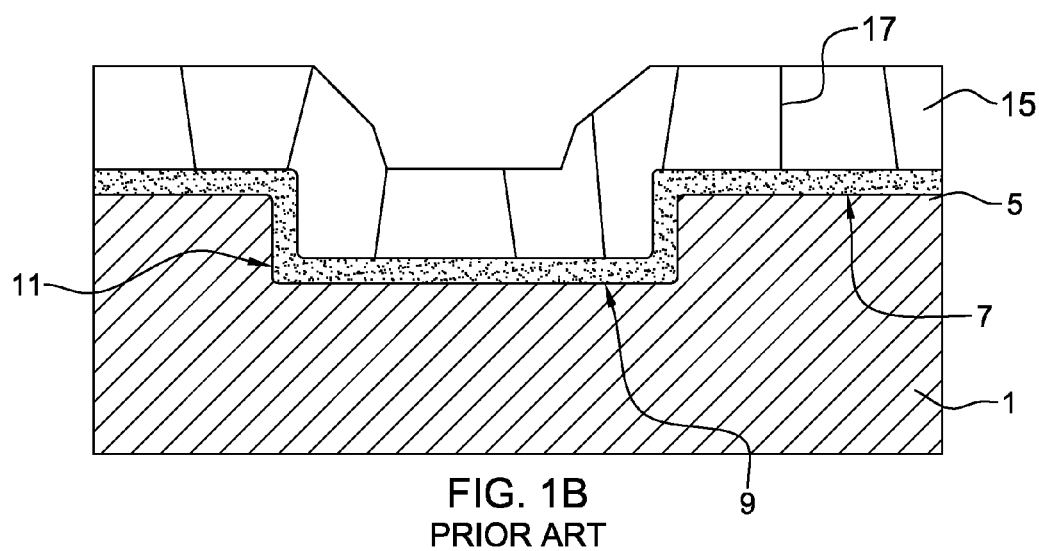
Figure 1C:
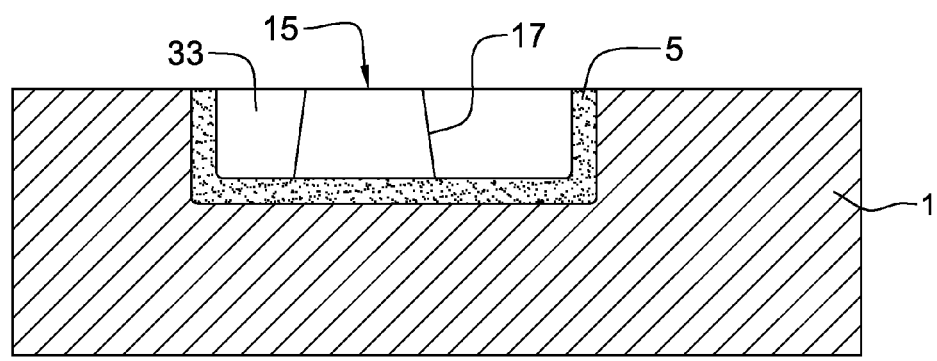

In FIG. 1B Cu layer 15 is annealed, typically for around one hour at around 100° C. As is understood, annealing causes Cu recrystallization and grain growth. Thus, as shown in FIG. 1B, large grain size with columnar or bamboo-type boundaries 17 are obtained by annealing with the grain boundaries generally perpendicular to the plane of the Cu layer such as to be oriented across the layer thickness and line width. As shown in FIG. 1C, after the annealing step, Cu layer 15 and liner 5 are etched back, for example, by CMP to planarize the top surface of semiconductor layer 1.

Figure 2A:
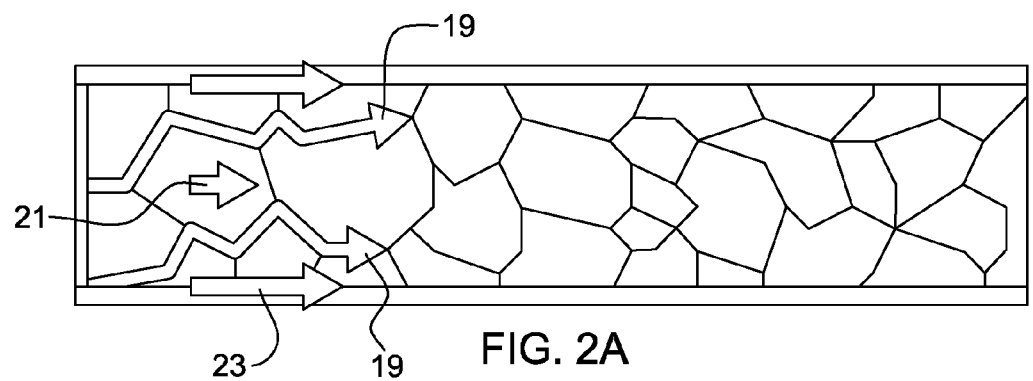
FIGS. 2A-2B depict grain structures as might be found in annealed aluminum (Al) or Cu.
Figure 2B:
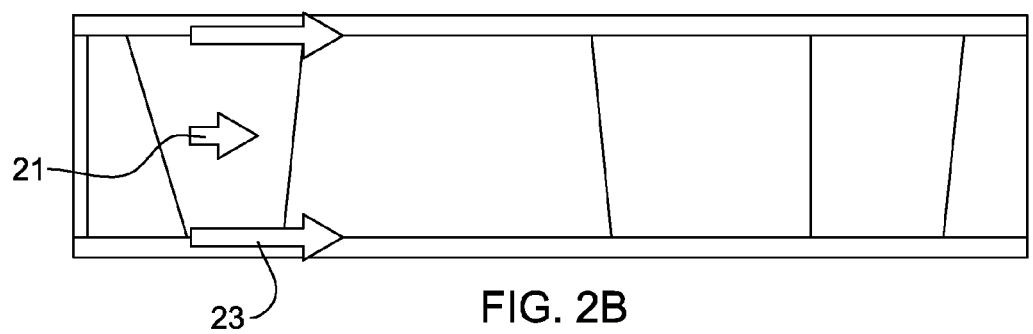

FIG. 2A depicts grain structure as may be found in Cu or Al, for example. The smaller multiple grain structure shown in FIG. 2A provides multiple grain boundaries that act as fast diffusion paths during electromigration. This is shown by arrows 19 in FIG. 2A. As shown in FIG. 2B, the layer of columnar or bamboo-type grain structure, with grain boundaries oriented perpendicular to the electromigration flux, act advantageously to slow down the mass transport. The diffusion paths of FIG. 2B are thus limited to lattice diffusion path 21 and interface diffusion paths 23.

Since recrystallization and grain growth by annealing are both a thermally activated process involving atomic diffusion, annealing at a higher temperature for a shorter time could achieve the desired recrystallization and grain growth and also save process time. However, the higher temperature employed in using this anneal approach results in reliability exposure due to stress voiding.

Stress voiding is a result of thermal stress generation and relaxation. In this regard, it is thought that the mismatch in thermal expansion coefficient between the metal film, such as a Cu film, and the surrounding dielectric and substrate creates significant thermal stress, induced from temperature change. Annealing at elevated temperatures, such as around 300° C. and above, causes compressive stress to be induced upon the metal film. The compressive stress tends to relax by atomic diffusion on the surface and grain boundaries and this diffusion acts to form hillocks on the free surface. As a result, the metal film is under large tensile stress when cooled to lower temperatures.

Figure 3A:
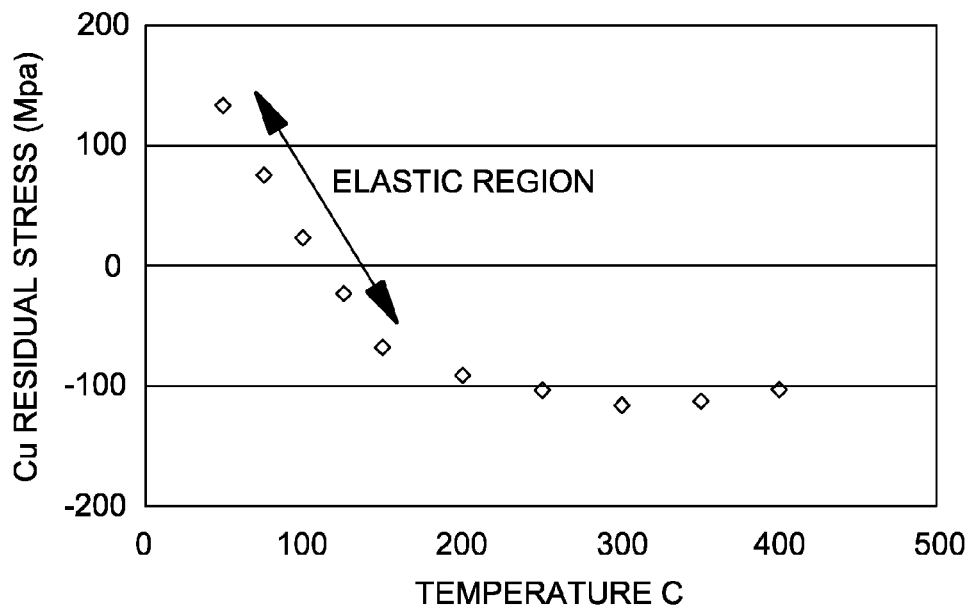
FIGS. 3A-3B show Cu stress as a function of thermal history for conventional annealing and for annealing with a stress locking cap, in accordance with the present invention.

FIG. 3A shows Cu stress as a function of thermal history using conventional annealing, as described in FIGS. 1A-1C. Residual stress, in Mega Pascals (MPa), was measured by X-ray diffraction and taken as a function of temperature. Compressive stress falls within the negative MPa values while tensile stress falls within the positive MPa values.

As shown in FIG. 3A, the elastic region of the Cu is limited. The Cu metallization behaves elastically only up to about 150° C. with the maximum compressive stress attainable being about 110 MPa. The latter value is limited by stress relaxation at the elevated temperatures.

Figure 3B:
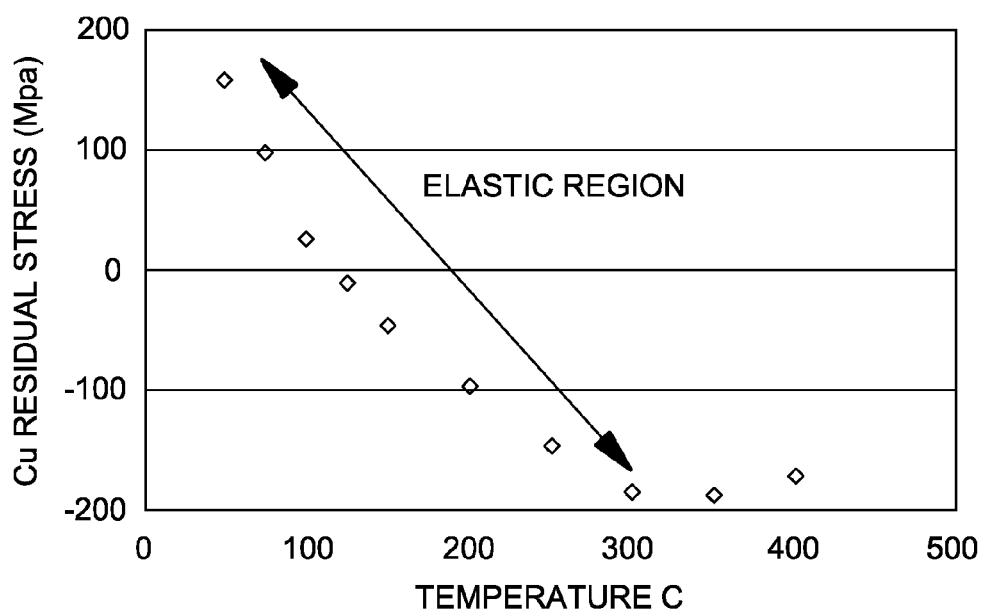

FIG. 3B shows the same Cu arrangement as tested in FIG. 3A with a stress locking layer or cap of TaN formed on the Cu, in accordance with the present invention. As can be seen, the elastic region is considerably extended. With the stress locking layer over the Cu, the elastic region extends up to about 300° C. until a significant plastic deformation occurs limiting the elasticity. The maximum compressive stress that the Cu film can sustain is almost 200 MPa.

Thus, it is clear that the stress locking layer is effective in promoting the elastic response in the plated Cu metallization, as well as extending the compressive yield point at elevated temperatures. The results are desirable to avoid stress hysteresis during pre-CMP annealing, and act to reduce tensile stress buildup at room temperature after anneal. The stress locking layer thus acts to reduce stress relaxation at elevated annealing temperatures. As a result, the tensile stress at lower use temperatures, such as device operating temperatures, is reduced thereby preventing stress voiding. For example, at 100° C. device operating temperature, stresses ranging from slightly compressive to zero MPa are possible. At room temperatures, stresses less than 100 MPa are obtained.

Accordingly, the results show that recrystallization and grain growth can be accelerated at higher pre-CMP annealing without creating stress voiding reliability problems. In this regard, voiding in metal interconnects, caused by high tensile stress, eventually causes resistance increase and electrical opens in the interconnect.

Figure 4A:
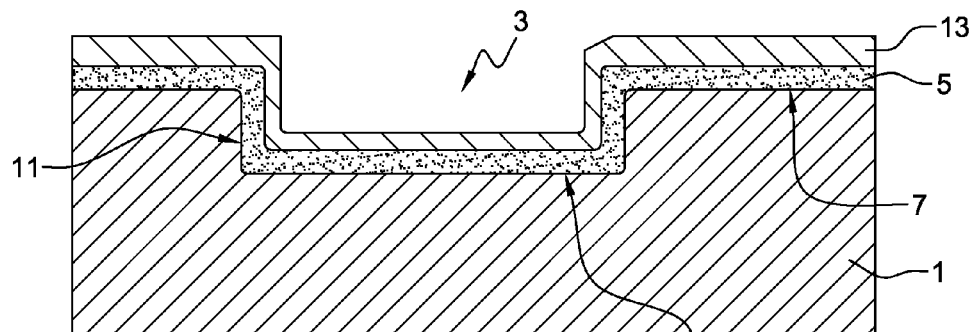
FIGS. 4A-4E show the processing steps for fabricating metallization, such as Cu metallization, with annealing that employs a stress locking cap layer, in accordance with the present invention.
Figure 4B:
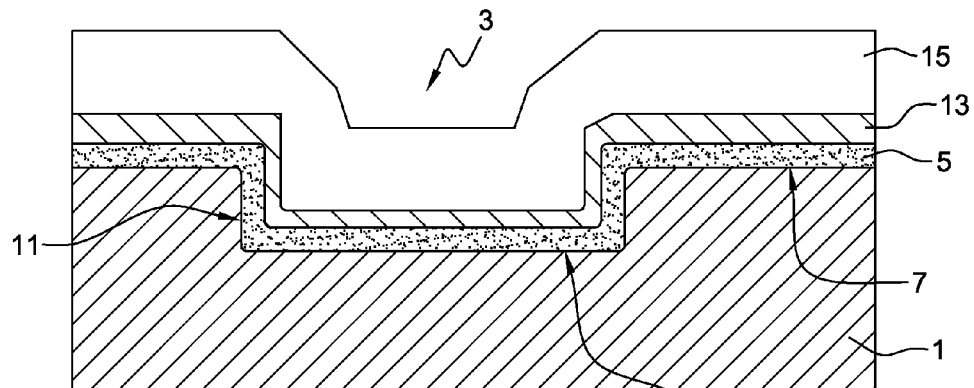

FIGS. 4A-4E show the metallization fabrication process with stress capping layer, in accordance with the present invention. FIGS. 4A-4B involve essentially the same process as previously described with regard to FIG. 1A wherein like parts or structures are shown with like reference characters.

Figure 4C:
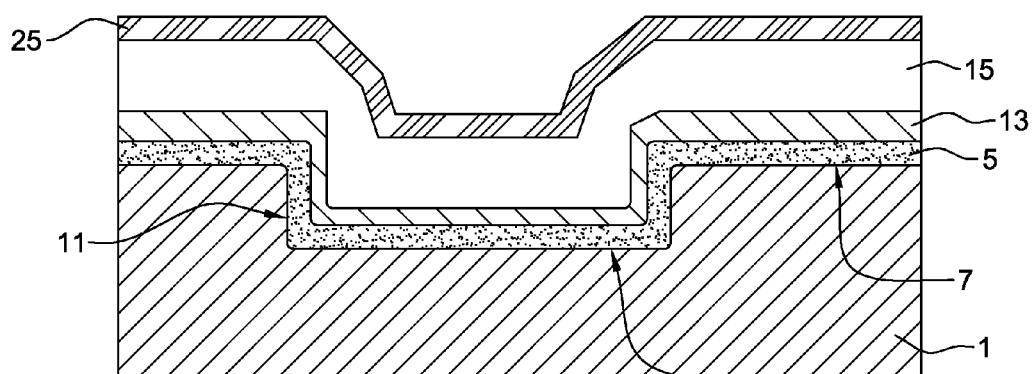

FIG. 4C shows the process step wherein a metal stress locking layer or cap 25 is formed on Cu layer 15. The stress locking layer may be any one of Ta, TaN, Ti, TiN, Ru, RuN, W, WN, Co and CoWP, or similar metals. The metal locking layer may be deposited by chemical-vapor deposition (CVD), physical vapor deposition (PVD), atomic layer deposition (ALD), plating, sputtering or any other desired deposition technique, as is well understood by those skilled in the art. Locking layer thickness may range between 1 nm and 100 nm. For adhesion enhancement to Cu, an alloy or mixture comprising Ti added to Ta, chromium (Cr), molybdenum (Mo), W, rhodium (Rh), Ru or rhenium (Re) may be used.

It is understood that there are a number of refractory metals that may be employed for the stress locking layer. However, materials containing Ti, Ta, Ru and Co are particularly applicable. Co-containing materials, for example, may include elemental Co alone or elemental Co and at least one of nitrogen (N), phosphorus (P), boron (B), W, Mo and Re. Thus, the stress locking layer may comprise Co, cobalt phosphide (CoP), cobalt boride (CoB) or CoWP.

Figure 4D:
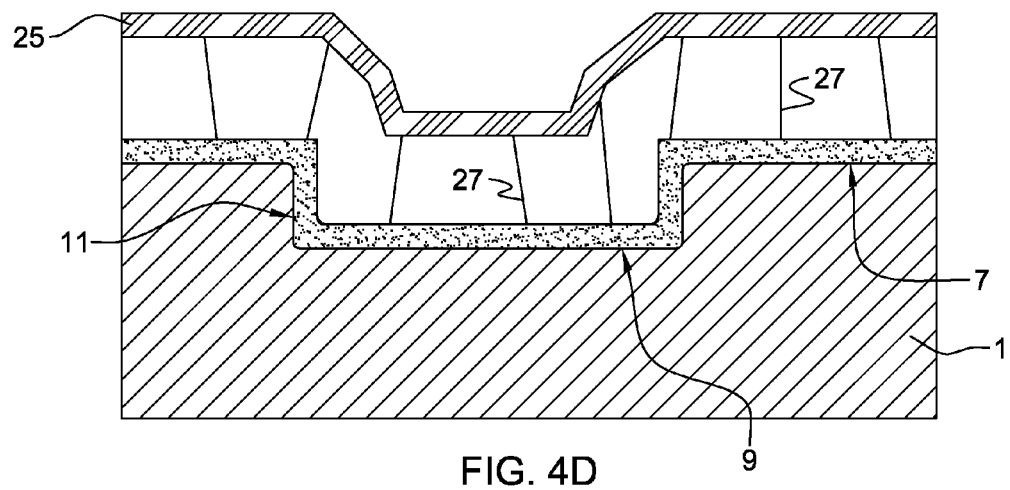

As shown in FIG. 4D, with locking layer in place, the structure shown may be subjected to an annealing step whereby the Cu is annealed to cause recrystallization and grain growth. Desired recrystallization and grain growth may be achieved by heating the Cu between about 150° C. and 400° C. for five to sixty minutes. The resulting grain growth produces grain size across the full thickness of the Cu layer or film with the orientation of the grain boundaries being generally perpendicular to the plane of the Cu layer or film and, thus, the electromigration flux path or current path. Grain size of 2 µm or greater may be obtained by the relatively shorter annealing process.

Figure 4E:
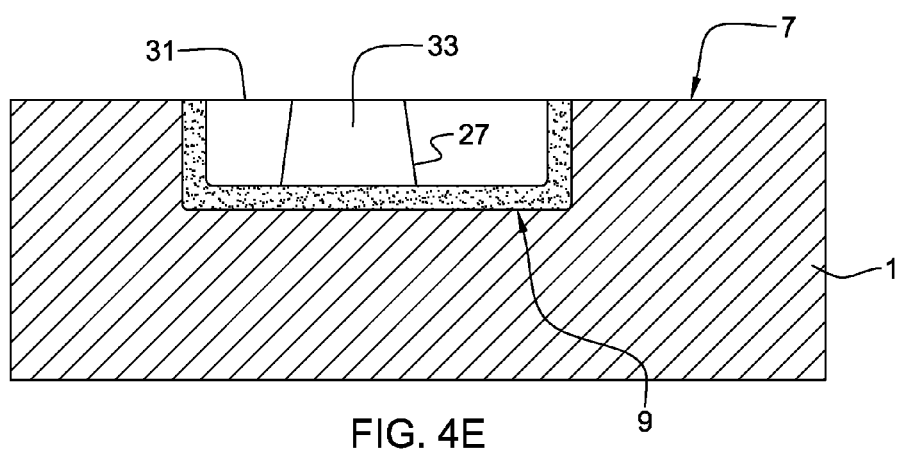

As shown in FIG. 4E, the semiconductor surface 7 is planarized by CMP, for example, leaving interconnect Cu line or film 31 with columnar or bamboo-type grains 33 having boundaries 27 across the full thickness of the line.

Figure 5:
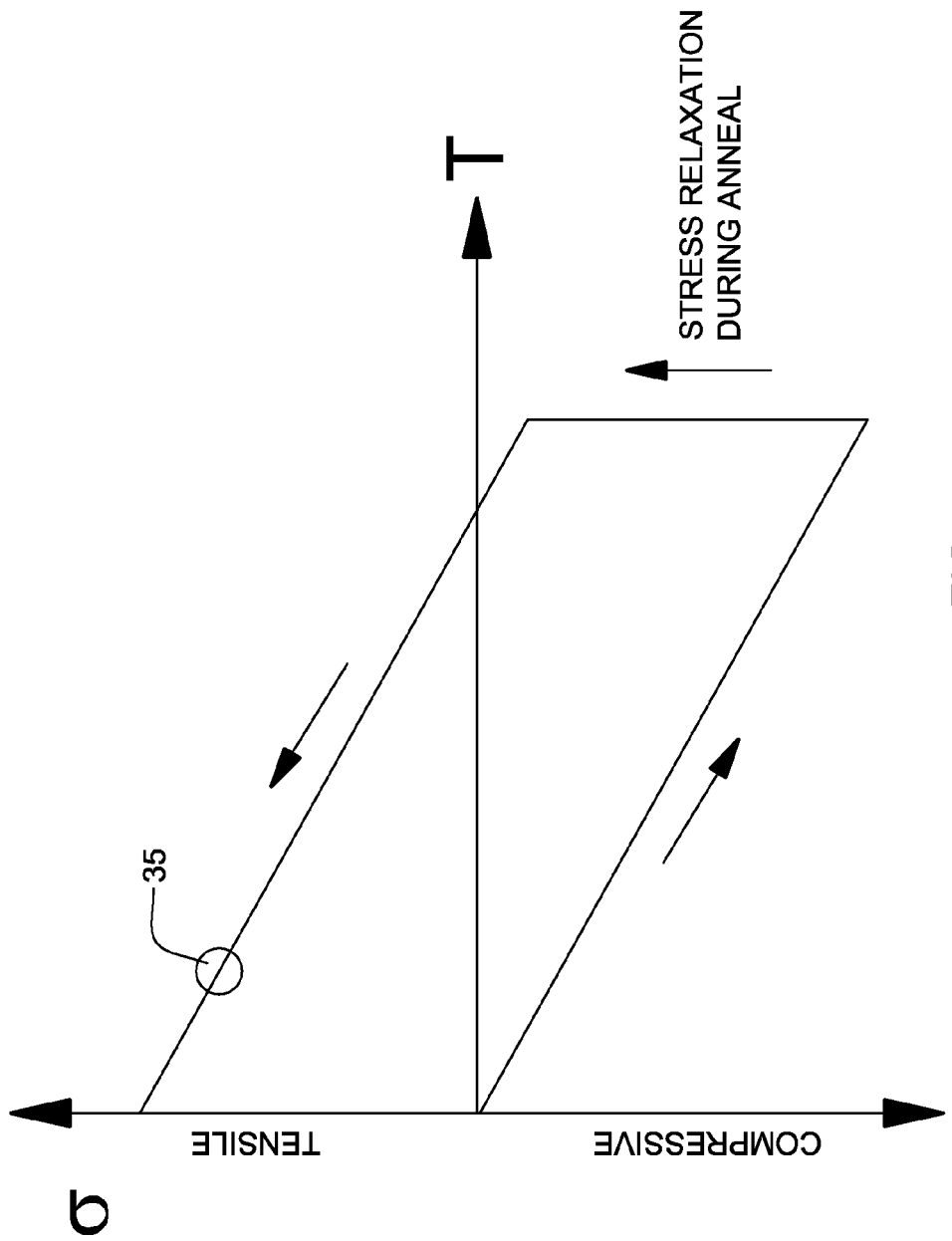
FIG. 5 shows a diagram of stress evolution in thermal history.

FIG. 5 shows a general plot of stress evolution as a function of thermal history. This plot represents stress evolution in conventional arrangements where no stress locking layer is present. As shown, starting at low or zero stress, as heat is applied during anneal, the annealed metal, such as Cu, is subjected to compressive force until the Cu stress relaxation point is reached and surface diffusion starts. This is shown by the vertical line extending upwardly until sufficient stress is relieved and the cooling process takes stress back to room temperature and a point of significant tensile stress. The point 35 is what might be the normal operating temperature of a device using the Cu interconnect. This point is typically around 100° C. and, as can be seen, it is a point where significant tensile stress exists.

By using the stress locking layer, in accordance with the present invention, the elastic region of the Cu is considerably extended to at least 300° C., as shown in FIGS. 3A-3B, such that stress relaxation by surface diffusion is substantially reduced, if not avoided. As a result, the compressive stress through annealing, as shown in FIG. 5, is allowed to extend downwardly to greater compressive stress values without stress relaxation. If any stress relaxation occurs, as in the case without the stress locking layer and shown by the upward extension of the thermal history, it is slow and minimal thus allowing the tensile stress created upon cooling to be near zero.

FIG. 6 shows the fiber or grain texture results of six samples of annealed Cu, both with and without stress caps. The fiber texture values shown represent [111] fiber texture. Measurements were made by X-ray diffraction at 25° C. X-ray intensity for each sample was measured from the (111) crystallographic plane and the (200) crystallographic plane and the results were used to form a ratio representing texture value. A larger ratio number indicates there are more (111) crystals in the Cu film than (200) plane, and thus a higher [111] texture. Higher [111] texture is more desirable for electromigration reliability.

All samples show some [111] texture, which is the preferred alignment of crystals with (111) planes parallel to the surface. However, as can be seen, the last four capped samples show a substantial increase in [111] texture over the two non-capped samples. TaN was used for the stress cap. As can also be seen, the two samples within the four capped samples that were annealed at 300° C. for sixty minutes show some improvement in texture over the two samples that were annealed at 100° C. for sixty minutes. Conversely, there was no difference in texture values between the two non-capped samples, one of which was annealed at 100° C. for sixty minutes and the other at 300° C. for sixty minutes.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method for forming an electrical interconnect structure, comprising:
    providing a dielectric substrate with a trench;
    conformally forming an interconnect layer of Cu on said substrate and in said trench with said layer of Cu having small multiple grain size structure providing multiple grain boundaries that act as fast diffusion paths during electromigration;
    forming a stress locking layer directly on said layer of Cu on said substrate and in said trench to lock stress and extend an elastic region of said layer of Cu during annealing so that relaxation by surface diffusion is reduced;
    then annealing said layer of Cu with said stress locking layer at a temperature between 150° C. and 400° C. for between five to sixty minutes to form an interconnect layer of Cu exhibiting low tensile stress and high fiber texture structure having larger grain and columnar microstructure boundaries with said columnar microstructure boundaries oriented substantially perpendicular to the conductive path of said interconnect layer of Cu; and
        then removing by chemical-mechanical polishing said stress locking layer and said layer of Cu on said substrate so as to planarize said layer of Cu in said trench to said dielectric substrate and expose said layer of Cu in said trench.

2. The method as set forth in claim 1 wherein said stress locking layer is selected from the group comprising Ta, TaN, Ru and CoWP.

3. The method as set forth in claim 1 wherein said stress locking layer and said layer of Cu are removed by chemical-mechanical polishing planarization.

4. The method as set forth in claim 1 wherein said annealing temperature is between 275° C. and 325° C. and said time is between five and fifteen minutes.

5. A method for annealing a thin layer of metal for recrystallization and grain growth in said metal, comprising:
    providing a layer of semiconductor substrate material having a top surface;
    forming a trench in said layer of semiconductor substrate material from said top surface;
    conformally forming a liner on said to surface of said substrate and in said trench;

conformally forming a layer of Cu on said liner on said substrate and in said trench with said layer of Cu having small multiple grain size structure providing multiple grain boundaries that act as fast diffusion paths during electromigration;

forming a stress locking layer on said layer of Cu to lock stress and extend an elastic region of said layer of Cu so that relaxation by surface diffusion is reduced during annealing and tensile stress in reduced upon cooling;

annealing said layer of Cu at a temperature between 150° C. and 400° C. for between five to sixty minutes whereby said stress locking layer acts to reduce stress relaxation by atomic diffusion at said annealing temperatures and said annealing temperature acts to increase grain size and fiber texture; and then removing said stress locking layer and said layer of Cu from the top surface of said substrate material so as to planarize said layer of Cu in said trench to the top surface of said semiconductor material and expose said layer of Cu in said trench.

6. The method as set forth in claim 5 wherein said stress locking layer is selected from the group comprising Ta, TaN, Ru and CoWP.

7. A method of forming an electrical interconnect structure for a semiconductor device, comprising:

providing a semiconductor substrate structure having a surface;

forming a trench in a portion of the surface area of said semiconductor substrate structure, said trench having side walls and a bottom surface;

blanket forming a conductive liner on said surface of said semiconductor structure and on the said side walls and bottom surface of said trench;

forming a seed layer over the surface of said conductive liner;

forming a layer of Cu over the surface of said seed layer; then forming a stress locking layer having a thickness of 1 nm to 100 nm over the surface of said layer of Cu so that said stress locking layer acts to lock stress and extend an elastic region of said layer of Cu during annealing to reduce relaxation of compressive stress through surface diffusion and reduce tensile stress upon cooling;

then annealing said layer of Cu at a temperature between 150° C. and 400° C. for between five and sixty minutes; and then removing said stress locking layer and said layer of Cu by planarizing said stress locking layer and said layer of Cu so as to form a Cu interconnect structure in said trench planar with a surface of said semiconductor structure by exposing said layer of Cu in said trench with said Cu interconnect structure thereby formed in said trench having large grain size and columnar microstructure boundaries with columnar microstructure boundaries oriented substantially perpendicular to the conductive path of said interconnect layer of Cu thereby reducing electromigration.

8. The method as set forth in claim 7 wherein said step of removing is done by chemical-mechanical polishing.

9. The method as set forth in claim 7, wherein said stress locking layer is TaN.

10. The method as set forth in claim 7, wherein said Cu interconnect has near zero tensile stress at about 100° C. device operating temperature.

11. The method as set forth in claim 10 wherein said grain structure has a high fiber texture structure.

* * * * *